(12) United States Patent
Zhang et al.

(10) Patent No.: US 11,266,032 B2
(45) Date of Patent: Mar. 1, 2022

(54) OUTER CASE AND OUTDOOR EQUIPMENT WITH THE SAME

(71) Applicant: HONGFUJIN PRECISION ELECTRONICS(TIANJIN)CO.,LTD., Tianjin (CN)

(72) Inventors: Ya-Ni Zhang, Tianjin (CN); Ming-Hua Duan, Tianjin (CN); Han-Yu Li, New Taipei (TW)

(73) Assignee: HONGFUJIN PRECISION ELECTRONICS (TIANJIN) CO., LTD., Tianjin (CN)

( * ) Notice: Subject to any disclaimer, the term of this patent is extended or adjusted under 35 U.S.C. 154(b) by 14 days.

(21) Appl. No.: 16/883,905

(22) Filed: May 26, 2020

(65) Prior Publication Data

US 2021/0195773 A1 Jun. 24, 2021

(30) Foreign Application Priority Data

Dec. 19, 2019 (CN) .......................... 201911315746.0

(51) Int. Cl.
*H05K 5/00* (2006.01)
*H05K 5/02* (2006.01)

(52) U.S. Cl.
CPC ......... *H05K 5/0217* (2013.01); *H05K 5/0213* (2013.01)

(58) Field of Classification Search
CPC ...... H05K 5/02; H05K 5/0213; H05K 5/0217; H05K 7/20736; H05K 7/20181; H05K 7/20572; H05K 7/20727; H05K 9/0041; F24F 13/082; F24F 13/28; F24F 1/0057; F24F 12/20; F25D 23/12

USPC ..... 454/184, 275, 276; 312/236, 213, 223.2, 312/100; 361/692, 694, 688–690, 695, 361/679.46–679.54

See application file for complete search history.

(56) References Cited

U.S. PATENT DOCUMENTS 3,210,456 A * 10/1965 Skubal ..................... H02B 7/06
174/16.1
5,332,872 A * 7/1994 Ewanek ................ F04D 29/663
181/224

(Continued)

FOREIGN PATENT DOCUMENTS

CA 3027529 * 12/2017
CN 109723340 A 5/2019

*Primary Examiner* — Janet M Wilkens
(74) *Attorney, Agent, or Firm* — ScienBiziP, P.C.

(57) ABSTRACT

An outer case includes an upper case, a lower case, and a plurality of guiding structures. The lower case includes a bottom wall defining a plurality of through holes. The guiding structures are arranged on the bottom wall. Each of the guiding structures includes a first guiding plate and a second guiding plate, the first guiding plate includes a first connecting part and a first blocking part connected with the first connecting part, the second guiding plate includes a second connecting part and a second blocking part connected with the second connecting part, the first connecting part and the second connecting part face each other. The first blocking part is suspended on the bottom wall through the first connecting part, the second blocking part is suspended on the bottom wall through the second connecting part, the first blocking part and the second blocking part are staggered.

16 Claims, 8 Drawing Sheets

(56) References Cited

U.S. PATENT DOCUMENTS

| | | | | |
|---|---|---|---|---|
| 6,229,701 B1* | 5/2001 | Kung | G06F 1/203 165/185 |
| 6,575,826 B2* | 6/2003 | Myint | E06B 7/02 454/276 |
| 7,379,298 B2* | 5/2008 | Walsh | H05K 5/0213 361/692 |
| 7,740,530 B2* | 6/2010 | Astourian | F24F 13/082 454/277 |
| 8,253,038 B2* | 8/2012 | Pai | H05K 9/0024 174/383 |
| 8,373,077 B2* | 2/2013 | Guan | H05K 5/0213 174/547 |
| 8,684,803 B2* | 4/2014 | Berkompas | F24F 13/082 454/277 |
| 8,714,666 B2* | 5/2014 | Nagahori | H05K 5/0213 312/213 |
| 10,021,808 B1* | 7/2018 | Nyland | H05K 5/0213 |
| 11,029,059 B2* | 6/2021 | Towner | H05K 7/20745 |
| 2006/0089096 A1* | 4/2006 | Wolm | B41J 29/377 454/184 |
| 2006/0148398 A1* | 7/2006 | Ruch | H05K 9/0041 454/184 |
| 2007/0139882 A1* | 6/2007 | Bartell | H05K 7/20736 361/695 |
| 2009/0052143 A1* | 2/2009 | Chiu | H05K 5/0213 361/724 |
| 2012/0327601 A1* | 12/2012 | Shintani | H05K 7/1432 361/697 |
| 2016/0095263 A1* | 3/2016 | Campbell | F24F 7/04 454/184 |
| 2016/0158678 A1* | 6/2016 | Ishii | B01D 46/2403 55/497 |
| 2017/0290206 A1 | 10/2017 | Juan et al. | |
| 2018/0356121 A1* | 12/2018 | Yang | F24F 13/085 |
| 2019/0154297 A1* | 5/2019 | Timbrell | F24F 11/33 |
| 2021/0195769 A1* | 6/2021 | Zhang | H05K 5/0204 |

\* cited by examiner

OUTER CASE AND OUTDOOR EQUIPMENT WITH THE SAME

FIELD

The subject matter herein generally relates to electronic equipment, and particularly to an outer case and outdoor equipment with the outer case.

BACKGROUND

Sometimes, some equipment needs to be installed outdoors, such as communication equipment and air conditioning equipment. In addition, the equipment can generate heat during operation.

BRIEF DESCRIPTION OF THE DRAWINGS

Implementations of the present disclosure will now be described, by way of embodiment, with reference to the attached figures.

DETAILED DESCRIPTION

Figure 1:
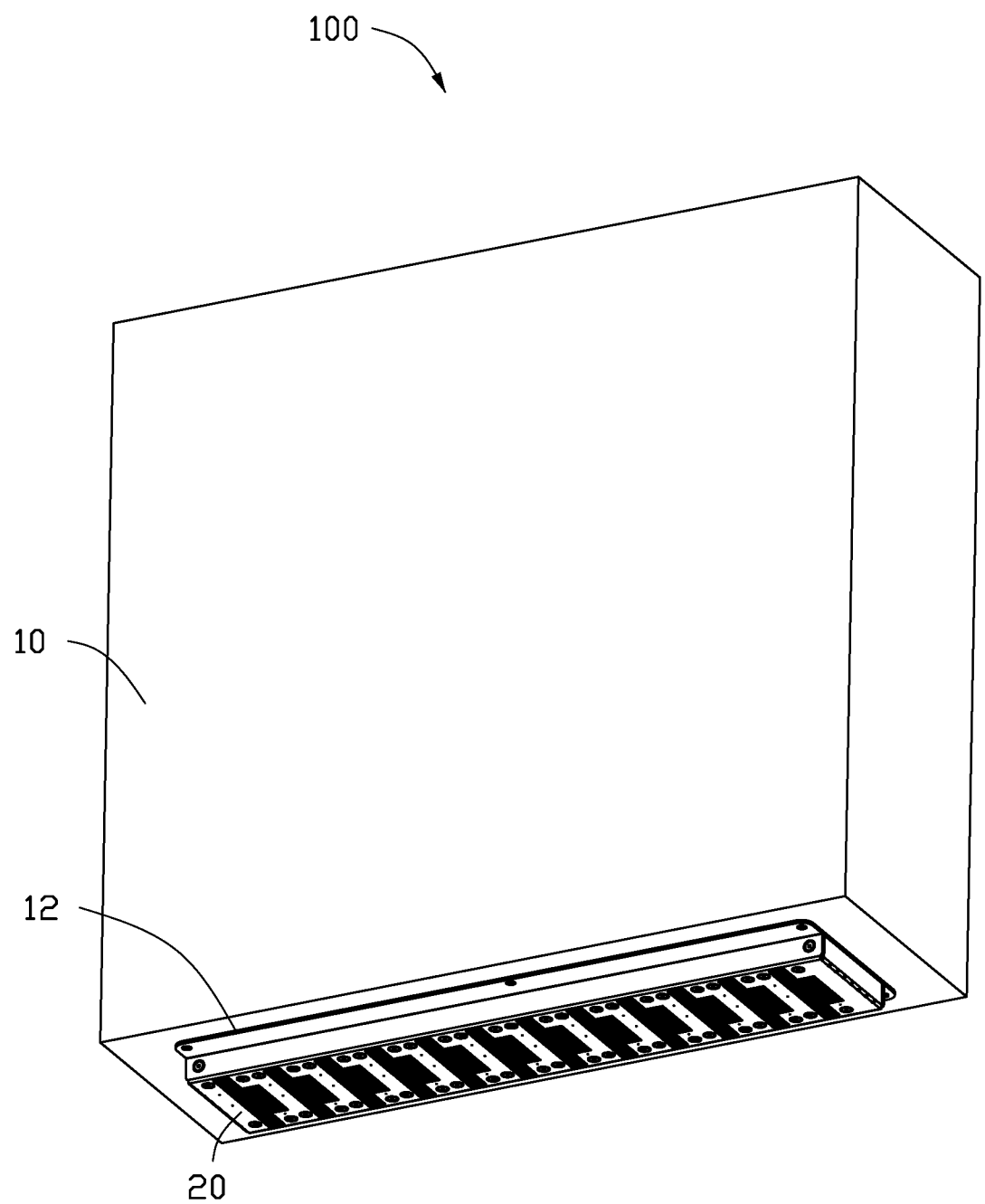
FIG. 1 is a schematic diagram of an outer case according to an embodiment of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the exemplary embodiments described herein. However, it will be understood by those of ordinary skill in the art that the exemplary embodiments described herein may be practiced without these specific details. In other instances, methods, procedures, and components have not been described in detail so as not to obscure the related relevant feature being described. Also, the description is not to be considered as limiting the scope of the exemplary embodiments described herein. The drawings are not necessarily to scale and the proportions of certain parts may be exaggerated to better illustrate details and features of the present disclosure.

The term "comprising" when utilized, means "including, but not necessarily limited to"; it specifically indicates open-ended inclusion or membership in the so-described combination, group, series, and the like. The disclosure is illustrated by way of example and not by way of limitation in the figures of the accompanying drawings in which like references indicate similar elements. It should be noted that references to "an" or "one" embodiment in this disclosure are not necessarily to the same embodiment, and such references can mean "at least one". In addition, the terms "first", "second", "third", and "fourth" are used for descriptive purposes only and cannot be understood as indicating or implying relative importance or implying the number of indicated technical features. Thus, the features defined as "first" and "second" may explicitly or implicitly include one or more of the said features. In the description of embodiments of the invention, "a plurality of" means two or more, unless otherwise specifically defined.

The terms "top", "bottom", "perpendicular", "parallel", "upper", "lower", "inside", "outside", and other indicating directions or positions are based on the directions or positions shown in the attached drawings In order to facilitate the description of the embodiment and simplify the description of the invention, rather than indicating or implying that the device or element referred to must have a specific orientation, be constructed and operated in a specific orientation, it cannot be understood as a limitation of the embodiment of the invention.

Figure 2:
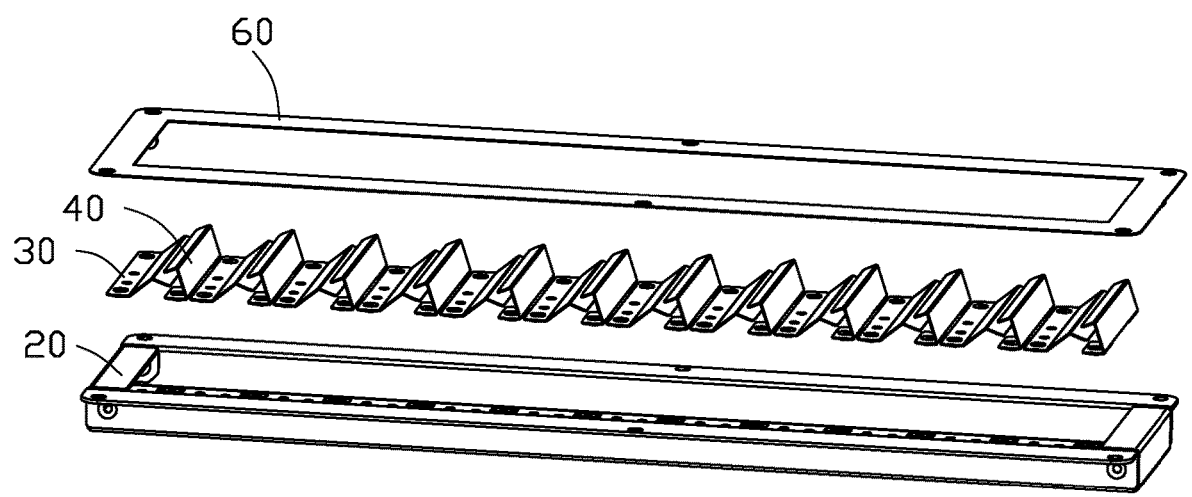
FIG. 2 illustrates an exploded view of the outer case of FIG. 1, the outer case including a lower case, a first guiding plate, and a second guiding plate.

Referring to FIGS. 1 and 2, an embodiment of the present disclosure provides an outer case 100 for outdoor equipment. The outer case 100 is configured to protect elements in the outdoor equipment from being wetted by rainwater, and has a ventilation function at the same time, so as to facilitate the elements in the outdoor equipment to dissipate heat.

The outer case 100 includes an upper case 10, a lower case 20, a plurality of first guiding plates 30, and a plurality of second guiding plates 40.

The upper case 10 and the lower case 20 can be mounted together. In the embodiment, the lower case 20 is detachably mounted at a bottom of the upper case 10.

Figure 3:
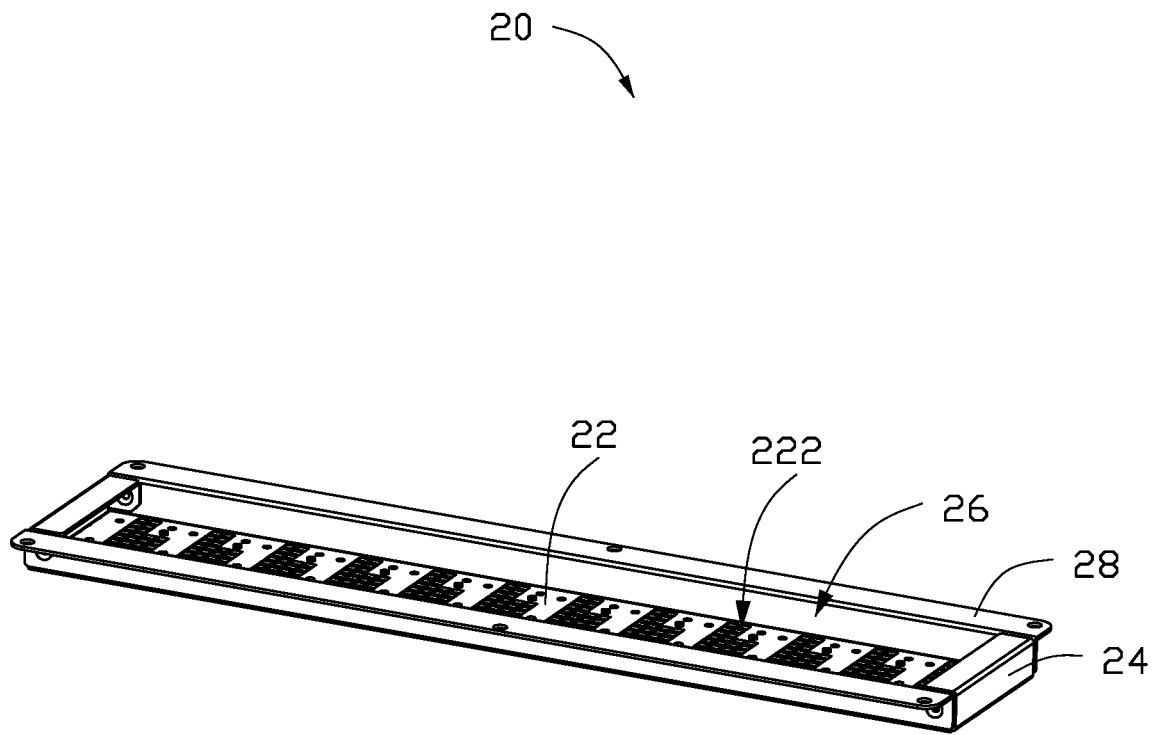
FIG. 3 is a schematic diagram of the lower case of FIG. 2 according to an embodiment of the present disclosure.

Referring to FIG. 3, in the embodiment, the lower case 20 includes a bottom wall 22, and a side wall 24 extending from the bottom wall 22 and surrounding the bottom wall 22. The side wall 24 is substantially perpendicular to the bottom wall 22. The bottom wall 22 together with the side wall 24 forms a receiving area 26 for receiving the plurality of first guiding plates 30 and the plurality of second guiding plates 40. In at least one embodiment, an angle between the bottom wall 22 and the side wall 24 can be greater or less than 90 degree.

The bottom wall 22 defines a plurality of through holes 222. The through holes 222 is used for ventilation and heat dissipation, so that the bottom wall 22 can be used to block dust or outdoor trash from entering the outdoor equipment, such as leaves or papers.

Figure 4:
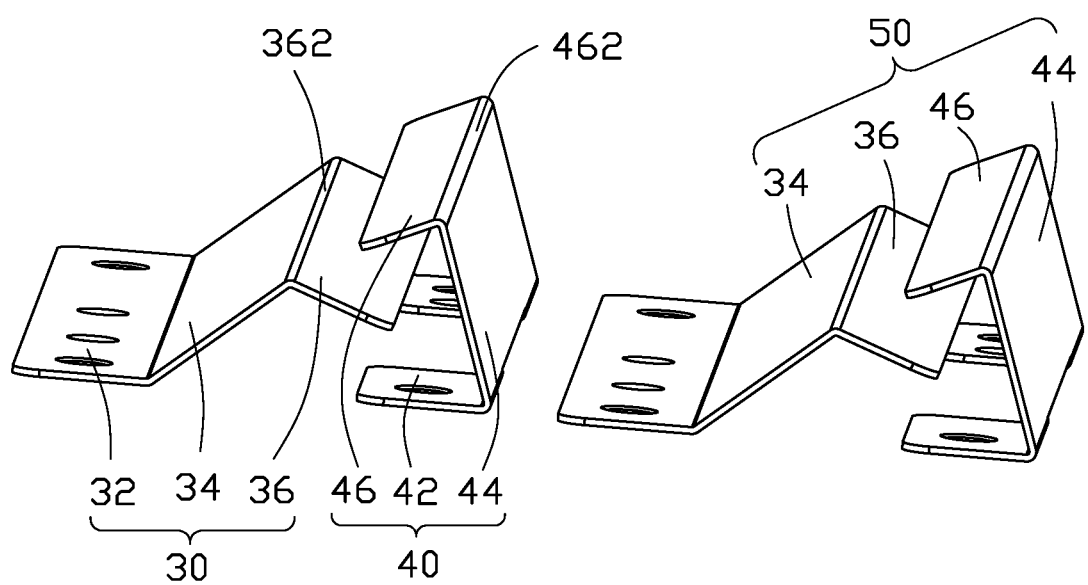
FIG. 4 is a schematic diagram of the first guiding plate and the second guiding plate of FIG. 2 according to a first embodiment of the present disclosure.

Referring to FIG. 4, the first guiding plate 30 includes a first mounting part 32, a first blocking part 36, and a first connecting part 34 interconnecting the first mounting part 32 and the first blocking part 36. In the embodiment, the first mounting part 32 and the first blocking part 36 are arranged at two different sides of the first connecting part 34. The first mounting part 32 extends from a first end of the first connecting part 34 along a first direction, and the first blocking part 36 extends from a second end of the first connecting part 34 away from the first end along a second direction. The second direction is different from the first direction. An angel between the first mounting part 32 and the first connecting part 34 can be same or different from an angle between the first blocking part 36 and the first connecting part 34. The first connecting part 34 and the first blocking part 36 meets at a first joint 362. The first mounting part 32 can be mounted to the bottom wall 22 by bonding or a screw connection.

In at least one embodiment, the first mounting part 32 and the first blocking part 36 may be arranged at the same side of the first connecting part 34.

The second guiding plate 40 includes a second mounting part 42, a second blocking part 46, and a second connecting part 44 interconnecting the second mounting part 42 and the second blocking part 46. The second mounting part 42 and the second blocking part 46 are arranged in the same side of the second connecting part 44. The second mounting part 42 extends from a third end of the second connecting part 44 along a third direction, and the second blocking part 46 extends from a fourth end of the second connecting part 44 away from the third end along a fourth direction. The fourth direction can be same or different from the third direction. An angel between the second mounting part 42 and the second connecting part 44 can be same or different from an angle between the second blocking part 46 and the second connecting part 44. The second connecting part 44 and the second blocking part 46 meets at a second joint 462. The second mounting part 42 can be used to mount the second guiding plate 40 on the lower case 20 of the bottom wall 22 by bonding or a screw connection. The second connecting part 44 and the second blocking part 46 can be used to guiding air flow and/or water flow.

In at least one embodiment, the second mounting part 42 and the second blocking part 46 can be arranged at two opposite sides of the second connecting part 44.

The plurality of first guiding plates 30 and the plurality of second guiding plates 40 are arranged alternatively in turn. The first connecting part 34 and the first blocking part 36 of each of the first guiding plates 30 together with the second connecting part 44 and the second blocking part 46 of adjacent second guiding plate 40 constitute a guiding structure 50.

Figure 5:
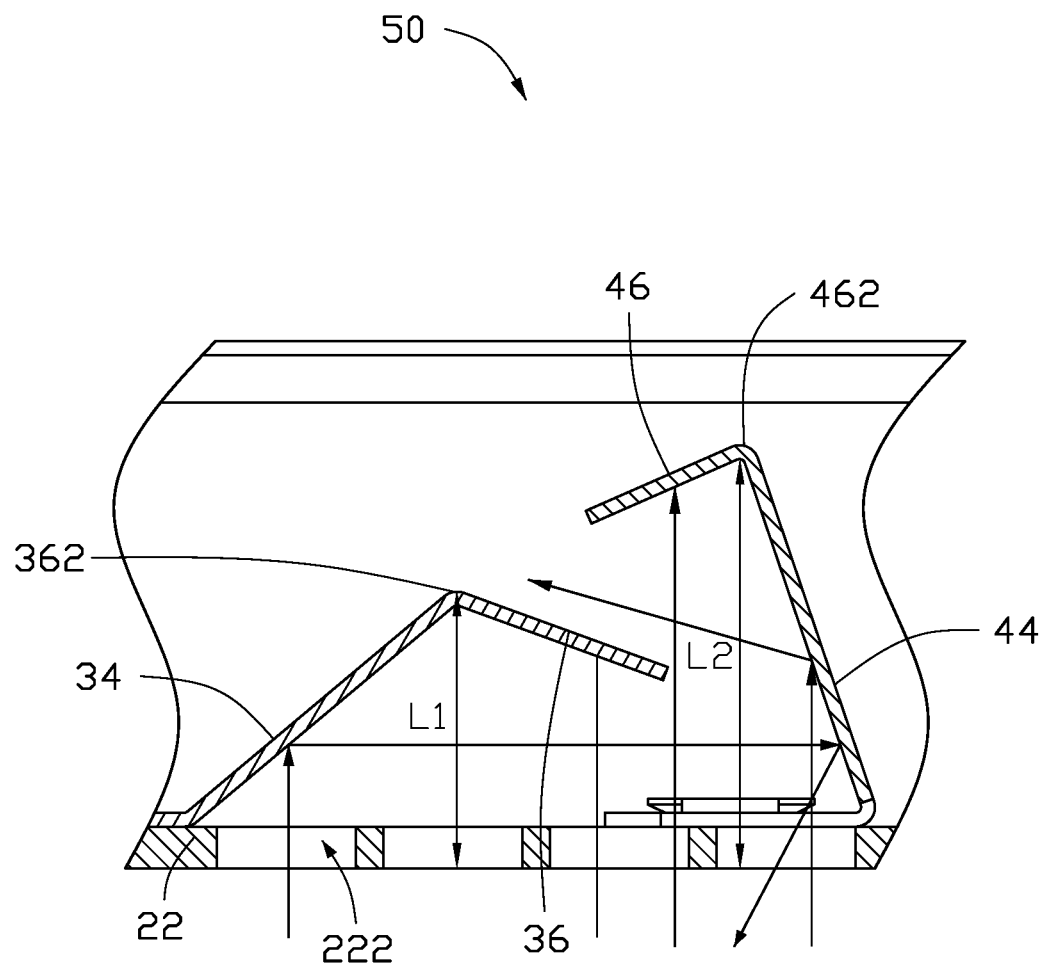
FIG. 5 illustrates a cross sectional view of the first guiding plate and the second guiding plate of FIG. 4.

Referring to FIG. 5, the first guiding plate 30 is mounted on the lower case 20 with the first mounting part 32 connected with the bottom wall 22, and the second guiding plate 40 is mounted on the lower case 20 with the second mounting part 42 connected with the bottom wall 22. A first distance L1 from the first joint 362 to the bottom wall 22 is less than a second distance L2 from the second joint 462 to the bottom wall 22. The first blocking part 36 is arranged at a side of the second blocking part 46 adjacent to the through holes 222. An angle between the first blocking part 36 and the bottom wall 22 is less than an angle between the second blocking part 46 and the bottom wall 22.

The first blocking part 36 is suspended on the bottom wall 22 through the first connecting part 34 and extends towards the bottom wall 22, the second blocking part 46 is suspended on the bottom wall 22 through the second connecting part 44 and the second blocking part 46 extends towards the bottom wall 22. The first blocking part 36 and the second blocking part 46 are staggered, in other words, the projection of the first blocking part 36 on the bottom wall 22 overlaps the projection of the second blocking part 46 on the bottom wall 22. Thus, water flow can be prevented from directly entering the interior of the outer case 100 through the through holes 222.

Water flow inside the outer case 100 can flow out through the through holes 222 and then flow out of the outer case 100 under the guide of the guiding structure 50. When unwanted water flow enters the outer case 100 from the through holes 222, part of the water flow can flow out from the through holes 222 under gravity and then fall onto the second blocking part 46 due to gravity of the water flow and a combination of a counterforce of the first connecting part 34, the first blocking part 36, the second connecting part 44, and the second blocking part 46 exerted on the water flow. For example, part of the water can flow out from the through holes 222 and fall down onto the first connecting part 34. The part of the water hits the first connecting part 34, at the same time, a counterforce of the first connecting part 34 may push the part of the water towards the second connecting part 44. The part of water may fall down to the second blocking part 46 or be pushed toward outside of the guiding structure 50 through a gap between the first blocking part 36 and the second blocking part 46. Finally, the water falling down on the second blocking part 46 may fall off the second blocking part 46 due to gravity.

Air flow inside the outer case 100 can flow out through the through holes 222 and then flow out of the outer case 100 under the guide of the guiding structure 50. On the other hand, air flow outside can flow into the outer case 100 under the guide of the guiding structure 50. In detail, air flow inside the outer case 100 can flow out through the through holes 222, and then flow out of the guiding structure 50 through the gap between the first blocking part 36 and the second blocking part 46 under a combination of impact forces of the air flow exerted on the first connecting part 34, the first blocking part 36, the second connecting part 44, and the second blocking part 46, and reacting forces of the first connecting part 34, the first blocking part 36, the second connecting part 44, and the second blocking part 46 exerted on the air flow. Air flow outside the outer case 100 can flow into the guiding structure 50 through the gap between the first blocking part 36 and the second blocking part 46, and then flow into the outer case 100 under a combination of impact forces of the air flow exerted on the first connecting part 34, the first blocking part 36, the second connecting part 44, and the second blocking part 46, and counterforces of the first connecting part 34, the first blocking part 36, the second connecting part 44, and the second blocking part 46 exerted on the air flow. The counterforces act on the air flow in a similar manner with those act on the water flow.

In at least one embodiment, the outer case 100 may include a plurality of the guiding structures 50 arranged along a line. Alternatively, in at least one embodiment, the plurality of the guiding structures 50 may be arranged in any suitable pattern to meet all kinds of ventilation requirements.

Figure 6:
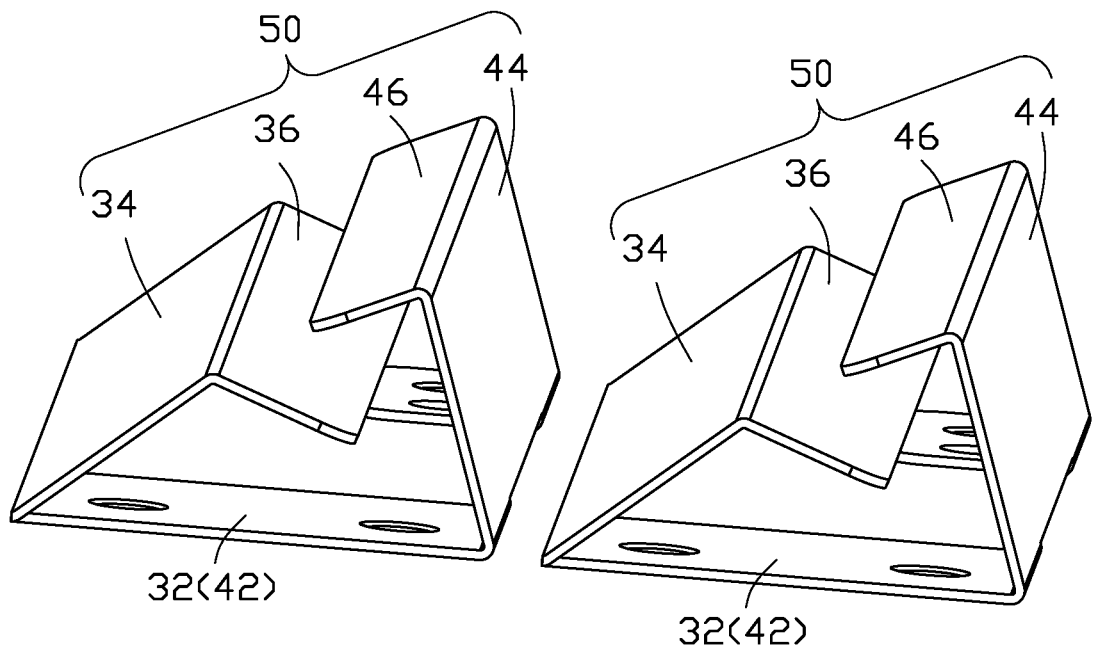
FIG. 6 is a schematic diagram of the first guiding plate and the second guiding plate of FIG. 2 according to a second embodiment of the present disclosure.
Figure 7:
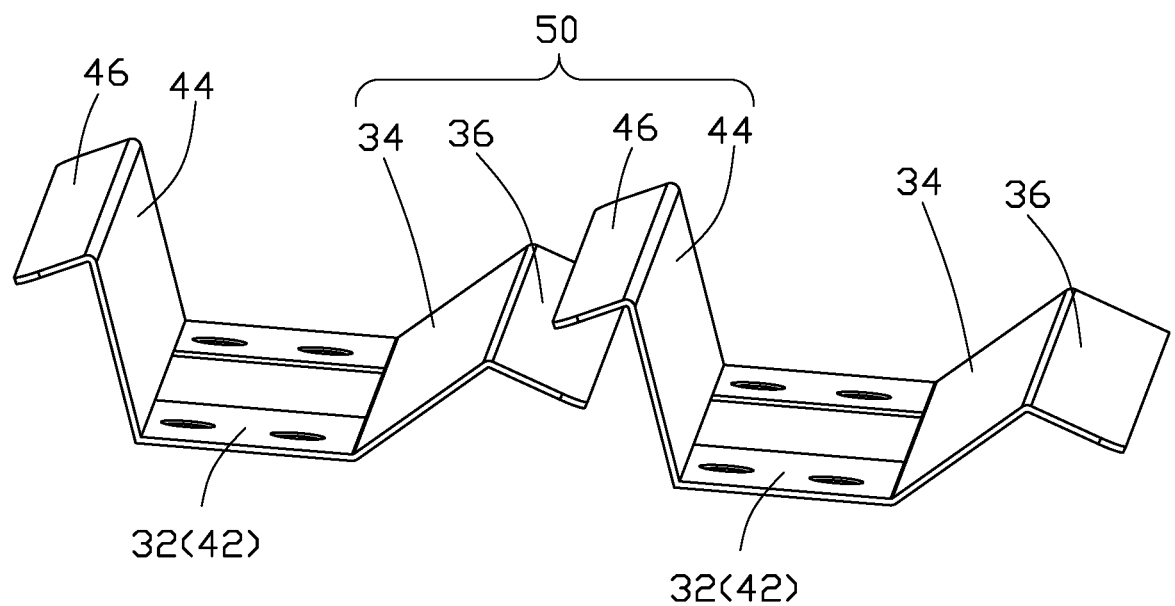
FIG. 7 is a schematic diagram of the first guiding plate and the second guiding plate of FIG. 2 according to a third embodiment of the present disclosure.

Referring to FIGS. 6 and 7, the first guiding plate 30 and the second guiding plate 40 may be formed integrally. In such arrangement, the first mounting part 32 and the second mounting part 42 can be integrated into one element. The first connecting part 34 and the second connecting part 44 are arranged at two opposite sides of the first mounting part 32 (the second mounting part 42). The first blocking part 36 is arranged at an end of the first connecting part 34 away from the first mounting part 32, and the second blocking part 46 is arranged at an end of the second connecting part 44 away from the second mounting part 42. In FIG. 6, an angle between the first mounting part 32 and the first connecting part 34 and an angle between the first mounting part 32 and the second connecting part 44 are both acute angles. The first mounting part 32, the first connecting part 34, the first blocking part 36, the second connecting part 44, and the second blocking part 46 forms the guiding structure 50. In FIG. 7, the angle between the first mounting part 32 and the first connecting part 34 and the angle between the first mounting part 32 and the second connecting part 44 are both obtuse angles. The first connecting part 34 and the first blocking part 36 of one of the plurality of first guiding plates 30 together with the second connecting part 44 and the second blocking part 46 of an adjacent one of the plurality of second guiding plates 40 form the guiding structure 50.

Referring back to FIG. 3, the lower case 20 further includes a third mounting part 28 extending away from the side wall 24. The third mounting part 28 is substantially parallel to the bottom wall 22. The upper case 10 includes a fourth mounting part 12 (showing in FIG. 1) corresponding to the third mounting part 28. The upper case 10 can be mounted with the lower case 20 by interconnecting the third mounting part 28 and the fourth mounting part 12.

The outer case 100 includes a waterproof cushion 60 (shown in FIG. 2) arranged between the third mounting part 28 and the fourth mounting part 12. The waterproof cushion 60 is in the same shape with the third mounting part 28 and/or the fourth mounting part 12. The waterproof cushion 60 can facilitate the connection between the third mounting part 28 and the fourth mounting part 12 more tight and waterproof.

Figure 8:
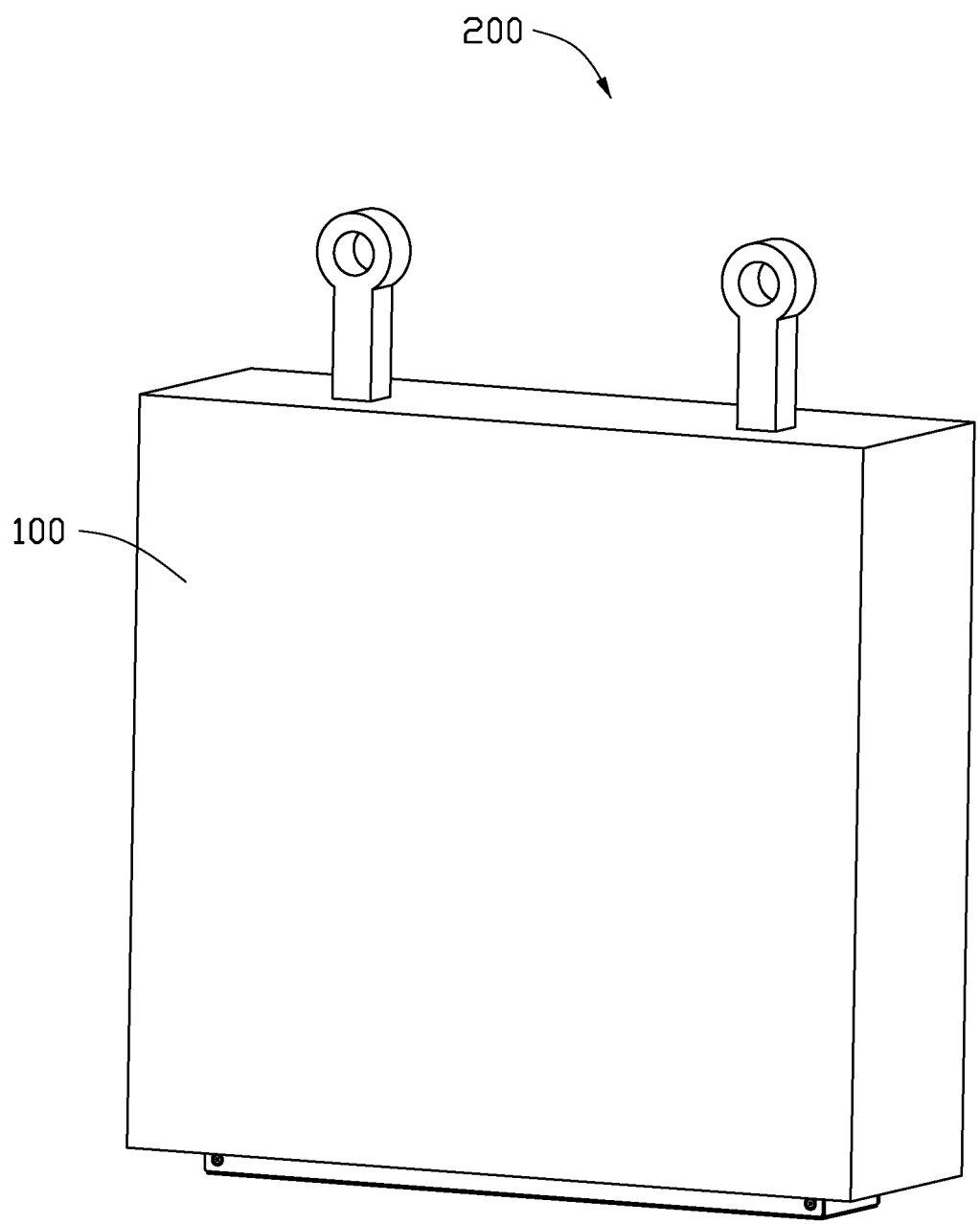
FIG. 8 is a schematic diagram of outdoor equipment according to an embodiment of the present disclosure.

Referring to FIG. 8, the present disclosure further provides outdoor equipment 200. The outdoor equipment 200 includes the outer case 100 of the above embodiments. The outdoor equipment 200 can be arranged in outdoor environments. The outdoor equipment 200 can be any types of electronic equipment suitable for being arranged outside, such as communication equipment and air condition equipment.

The outer case 100 of the present disclosure includes the guiding structure 50, the first blocking part 36 and the second blocking part 46 are staggered, thus, the outer case 100 has good ventilation function and waterproof function.

It is to be understood, even though information and advantages of the present exemplary embodiments have been set forth in the foregoing description, together with details of the structures and functions of the present exemplary embodiments, the disclosure is illustrative only. Changes may be made in detail, especially in matters of shape, size, and arrangement of parts within the principles of the present exemplary embodiments to the full extent indicated by the plain meaning of the terms in which the appended claims are expressed.

What is claimed is:

1. An outer case comprising:
   an upper case;
   a lower case connected with the upper case, wherein the lower case comprises a bottom wall defining a plurality of through holes; and
   a plurality of guiding structures arranged on the bottom wall, wherein each of the plurality of guiding structures includes a first guiding plate and a second guiding plate, the first guiding plate includes a first connecting part and a first blocking part connected with the first connecting part, the second guiding plate includes a second connecting part and a second blocking part connected with the second connecting part, the first connecting part and the second connecting part face each other;
   wherein the first blocking part is suspended on the bottom wall through the first connecting part and extends from the first connecting part towards the bottom wall, the second blocking part is suspended on the bottom wall through the second connecting part and extends from the second connecting part towards the bottom wall, the first blocking part and the second blocking part are staggered, a projection of the first blocking part on the bottom wall and a projection of the second blocking part on the bottom wall partially coincide; the lower case includes a side wall surrounding the bottom wall, the side wall together with the bottom wall defines a receiving area for receiving the plurality of guiding structures, the outer case further includes a waterproof cushion, the lower case further includes a third mounting part extending from the side wall, the upper case includes a fourth mounting part corresponding to the third mounting part, the waterproof cushion is arranged between the third mounting part and the fourth mounting part.

2. The outer case according to claim 1, wherein an angle between the first blocking part and the bottom wall is less than an angle between the second blocking part and the bottom wall.

3. The outer case according to claim 1, wherein a distance from a first joint where the first connecting part and the first blocking part meet to the bottom wall is less than a distance from a second joint where the second connecting part and the second blocking part meet to the bottom wall.

4. The outer case according to claim 1, wherein the first guiding plate includes a first mounting part connected with the first connecting part, the second guiding plate includes a second mounting part connected with the second connecting part, the first guiding plate is connected to the bottom wall through the first mounting part and the second guiding plate is connected to the bottom wall through the second mounting part.

5. The outer case according to claim 4, wherein the first mounting part and the first blocking part are arranged on the same side or opposite sides of the first connecting part.

6. The outer case according to claim 4, wherein the second mounting part and the second blocking part are arranged on the same side or opposite sides of the second connecting part.

7. The outer case according to claim 4, wherein the first guiding plate and the second guiding plate are integrally formed, the first mounting part and the second mounting part coincide.

8. The outer case according to claim 7, wherein an angle between the first connecting part and the first mounting part and an angle between the second connecting part and the second mounting part both are acute angles or obtuse angles.

9. Outdoor equipment comprising an outer case, wherein the outer case comprises:
   an upper case;
   a lower case connected with the upper case, wherein the lower case comprises a bottom wall defining a plurality of through holes; and
   a plurality of guiding structures arranged on the bottom wall, wherein each of the plurality of guiding structures includes a first guiding plate and a second guiding plate, the first guiding plate includes a first connecting part and a first blocking part connected with the first connecting part, the second guiding plate includes a second connecting part and a second blocking part connected with the second connecting part, the first connecting part and the second connecting part face each other;
   wherein the first blocking part is suspended on the bottom wall through the first connecting part and extends from the first connecting part towards the bottom wall, the second blocking part is suspended on the bottom wall through the second connecting part and extends from the second connecting part towards the bottom wall, the first blocking part and the second blocking part are staggered, a projection of the first blocking part on the bottom wall and a projection of the second blocking part on the bottom wall partially coincide; the lower case includes a side wall surrounding the bottom wall, the side wall together with the bottom wall defines a receiving area for receiving the plurality of guiding structures, the outer case further comprises a waterproof cushion, the lower case further includes a third mounting part extending from the side wall, the upper case includes a fourth mounting part corresponding to the third mounting part, the waterproof cushion is arranged between the third mounting part and the fourth mounting part.

10. The outdoor equipment according to claim 9, wherein an angle between the first blocking part and the bottom wall is less than an angle between the second blocking part and the bottom wall.

11. The outdoor equipment according to claim 9, wherein a distance from a first joint where the first connecting part and the first blocking part meet to the bottom wall is less than a distance from a second joint where the second connecting part and the second blocking part meet to the bottom wall.

12. The outdoor equipment according to claim 9, wherein the first guiding plate includes a first mounting part connected with the first connecting part, the second guiding plate includes a second mounting part connected with the second connecting part, the first guiding plate is connected to the bottom wall through the first mounting part and the second guiding plate is connected to the bottom wall through the second mounting part.

13. The outdoor equipment according to claim 12, wherein the first mounting part and the first blocking part are arranged on the same side or opposite sides of the first connecting part.

14. The outdoor equipment according to claim 12, wherein the second mounting part and the second blocking part are arranged on the same side or opposite sides of the second connecting part.

15. The outdoor equipment according to claim 12, wherein the first guiding plate and the second guiding plate are integrally formed, the first mounting part and the second mounting part coincide.

16. The outdoor equipment according to claim 15, wherein an angle between the first connecting part and the first mounting part and an angle between the second connecting part and the second mounting part both are acute angles or obtuse angles.

* * * * *